United States Patent
Nurmetov et al.

(10) Patent No.: US 10,352,792 B2
(45) Date of Patent: Jul. 16, 2019

(54) DEVICE AND METHOD FOR ON-CHIP MECHANICAL STRESS SENSING

(71) Applicant: Texas Instruments Incorporated, Dallas, TX (US)

(72) Inventors: Umidjon Nurmetov, Munich (DE); Ralf Peter Brederlow, Poing (DE); Baher Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/649,934

(22) Filed: Jul. 14, 2017

(65) Prior Publication Data
US 2018/0231424 A1    Aug. 16, 2018

Related U.S. Application Data

(60) Provisional application No. 62/459,140, filed on Feb. 15, 2017.

(51) Int. Cl.
| | |
|---|---|
| *G01L 1/22* | (2006.01) |
| *H01L 27/06* | (2006.01) |
| *G01L 1/16* | (2006.01) |
| *H01L 29/84* | (2006.01) |
| *G01L 5/16* | (2006.01) |

(Continued)

(52) U.S. Cl.
CPC ............ *G01L 1/2293* (2013.01); *G01L 1/162* (2013.01); *G01L 1/2281* (2013.01); *G01L 5/162* (2013.01); *G01L 25/006* (2013.01); *H01L 27/0647* (2013.01); *H01L 27/22* (2013.01); *H01L 29/84* (2013.01); *H01L 29/8605* (2013.01)

(58) Field of Classification Search
CPC ..... G01L 1/162; G01L 1/2281; G01L 1/2293; G01L 5/162; G01L 25/006; H01L 27/22; H01L 29/84
See application file for complete search history.

(56) References Cited

U.S. PATENT DOCUMENTS 3,965,453 A * 6/1976 Seidel ................. H01L 27/0802
                                                            338/13
3,994,010 A * 11/1976 Geske ..................... H01L 27/22
                                                            257/427

(Continued)

*Primary Examiner* — David J Bolduc
(74) *Attorney, Agent, or Firm* — Michael A. Davis, Jr.; Charles A. Brill; Frank D. Cimino

(57) ABSTRACT

An integrated circuit (IC) chip includes a substrate of a piezo-electric material having a first resistivity coefficient associated with a first direction that is longitudinal to a first crystal axis and a second resistivity coefficient associated with a second direction that is transverse to the first crystal axis. The first and second resistivity coefficients have opposite signs. The IC chip also includes a first stress sensing element formed in the substrate and coupled to pass a first current therethrough. The first stress sensing element includes a first resistor aligned such that the major direction of current flow through the first resistor is in the first direction and a second resistor coupled in series with the first resistor and aligned such that the major direction of current flow through the second resistor is in the second direction. A ratio of the resistance of the second resistor to the resistance of the first resistor is equal to a value α, where α is equal to the ratio of the first resistivity coefficient to the second resistivity coefficient.

17 Claims, 9 Drawing Sheets

(51) Int. Cl.
*H01L 27/22* (2006.01)
*G01L 25/00* (2006.01)
*H01L 29/8605* (2006.01)

(56) References Cited

U.S. PATENT DOCUMENTS

| | | | | |
|---|---|---|---|---|
| 4,317,126 A | * | 2/1982 | Gragg, Jr. | H01L 29/84 |
| | | | | 257/419 |
| 4,618,397 A | * | 10/1986 | Shimizu | G01L 9/0042 |
| | | | | 438/53 |
| 4,739,381 A | * | 4/1988 | Miura | G01L 1/18 |
| | | | | 257/417 |
| 4,905,523 A | * | 3/1990 | Okada | G01L 1/18 |
| | | | | 73/862.044 |
| 4,967,605 A | * | 11/1990 | Okada | G01L 1/18 |
| | | | | 73/514.33 |
| 5,513,536 A | * | 5/1996 | Reger | B25J 13/085 |
| | | | | 73/814 |
| 6,595,065 B2 | * | 7/2003 | Tanizawa | G01L 9/0055 |
| | | | | 73/720 |
| 6,858,451 B2 | * | 2/2005 | Suzuki | H01L 24/83 |
| | | | | 257/48 |
| 6,887,734 B2 | * | 5/2005 | Katsumata | G01L 9/0042 |
| | | | | 438/50 |
| 2002/0167058 A1 | * | 11/2002 | Toyoda | G01L 9/0054 |
| | | | | 257/417 |
| 2004/0173027 A1 | * | 9/2004 | Katsumata | G01L 1/2281 |
| | | | | 73/754 |
| 2004/0177699 A1 | * | 9/2004 | Katsumata | G01L 9/0042 |
| | | | | 73/754 |
| 2007/0228500 A1 | * | 10/2007 | Shimazu | G01B 7/18 |
| | | | | 257/417 |
| 2008/0202249 A1 | * | 8/2008 | Yokura | G01K 5/52 |
| | | | | 73/726 |
| 2011/0239784 A1 | * | 10/2011 | Ohsato | G01L 5/162 |
| | | | | 73/862.044 |
| 2012/0210800 A1 | * | 8/2012 | Huber | G01D 3/0365 |
| | | | | 73/777 |
| 2013/0113056 A1 | * | 5/2013 | Hashimoto | B81B 7/0054 |
| | | | | 257/417 |
| 2013/0205910 A1 | * | 8/2013 | Gharib | G01B 5/0014 |
| | | | | 73/777 |
| 2018/0164168 A1 | * | 6/2018 | Miyajima | G01L 9/00 |

* cited by examiner

DEVICE AND METHOD FOR ON-CHIP MECHANICAL STRESS SENSING

CLAIM OF PRIORITY AND RELATED PATENT APPLICATIONS

This nonprovisional application claims priority based upon the following prior U.S. provisional patent application(s): (i) "A Novel Method of Mechanical Stress Sensing for On-chip Sensors and Stress Compensation Circuits," Application No. 62/459,140, filed Feb. 15, 2017, in the name(s) of Umidjon Nurmetov, Ralf Peter Brederlow and Baher Haroun; which is hereby incorporated by reference in its entirety.

FIELD OF THE DISCLOSURE

Disclosed embodiments relate generally to the field of mechanical stress sensing in semiconductor devices. More particularly, and not by way of any limitation, the present disclosure is directed to a device and method for on-chip mechanical stress sensing.

BACKGROUND

Mechanical stress changes devices, e.g., the dimensions of the device, which changes the circuit parameters associated with the devices. These circuit parameters, e.g., the resistivity of resistors and the frequency of an integrated oscillator, can respond differently to mechanical stress in the x- and y-directions, so determining values for each of the major stress components is desirable in order to accurately measure and respond to the stress. Previous methods have utilized combinations of diffused resistors to extract the stress components. However, these solutions tend to add both circuit complexity and require complex mathematical calculations during post-processing of the resultant measurements.

SUMMARY

Disclosed embodiments provide a method and device that simplify the determination of the components of a stress applied to an integrated circuit (IC) chip. In one embodiment, one of the stress components is cancelled within the stress sensor so that a stress component can be measured directly without additional circuit components. The method is equally sensitive to both stress components, which eases information processing in the compensation circuits. Further, disclosed embodiments achieve these advantages without performing complex mathematical calculations at post-processing.

In one aspect, an embodiment of an integrated circuit is disclosed. The integrated circuit includes a substrate comprising a piezo-electric material having a first resistivity coefficient associated with a first direction that is longitudinal to a first crystal axis [100] and a second resistivity coefficient associated with a second direction that is transverse to the first crystal axis, the first and second resistivity coefficients having opposite signs; and a first stress sensing element formed in the substrate and coupled to pass a first current therethrough, the first stress sensing element comprising a first resistor aligned such that the major direction of current flow through the first resistor is in the first direction and a second resistor coupled in series with the first resistor and aligned such that the major direction of current flow through the second resistor is in the second direction, wherein a ratio of the resistance of the second resistor to the resistance of the first resistor is equal to a value $\alpha$, $\alpha$ being equal to the ratio of the first resistivity coefficient to the second resistivity coefficient.

In another aspect, an embodiment of an integrated circuit is disclosed. The integrated circuit includes a substrate comprising a piezo-electric material having a first resistivity coefficient associated with a first direction that is longitudinal to a first crystal axis and a second resistivity coefficient associated with a second direction that is transverse to the first crystal axis, the first and second resistivity coefficients having opposite signs; and a first stress sensing element formed in the substrate, the first stress sensing element comprising a first resistor coupled between a first current source and a lower rail, the first resistor aligned such that the major direction of current flow through the first resistor is in the first direction, a first voltage being taken between the first current source and the first resistor and a second resistor coupled between a second current source and the lower rail, the second resistor aligned such that the major direction of current flow through the second resistor is in the second direction, a second voltage being taken between the second current source and the second resistor, a ratio of the current provided by the first current source to the current provided by the second current source being equal to $\alpha$, $\alpha$ being equal to the ratio of the second resistivity coefficient to the first resistivity coefficient and a first combining circuit coupled to add the first voltage and the second voltage and to provide a third voltage that is proportional to a component of stress associated with the second direction.

In yet another aspect, an embodiment of an integrated circuit is disclosed. The integrated circuit includes a substrate comprising a piezo-electric material having a first resistivity coefficient associated with a first direction that is longitudinal to a first crystal axis and a second resistivity coefficient associated with a second direction that is transverse to the first crystal axis, the first and second resistivity coefficients having opposite signs; a first stress sensing element formed in the substrate, the first stress sensing element comprising a first resistor coupled between a first current source and a lower rail, the first resistor aligned such that the major direction of current flow through the first resistor is in the first direction, a second resistor coupled between a second current source and the lower rail, the second resistor aligned such that the major direction of current flow through the second resistor is in a third direction that is orthogonal to both the first and second directions, the first current source and the second current source each providing a given current, and a first difference circuit coupled to receive a first voltage taken between the first resistor and the first current source and a second voltage taken between the second resistor and the second current source, the first difference circuit providing a third voltage equal to the difference between the first and second voltages.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 10A:
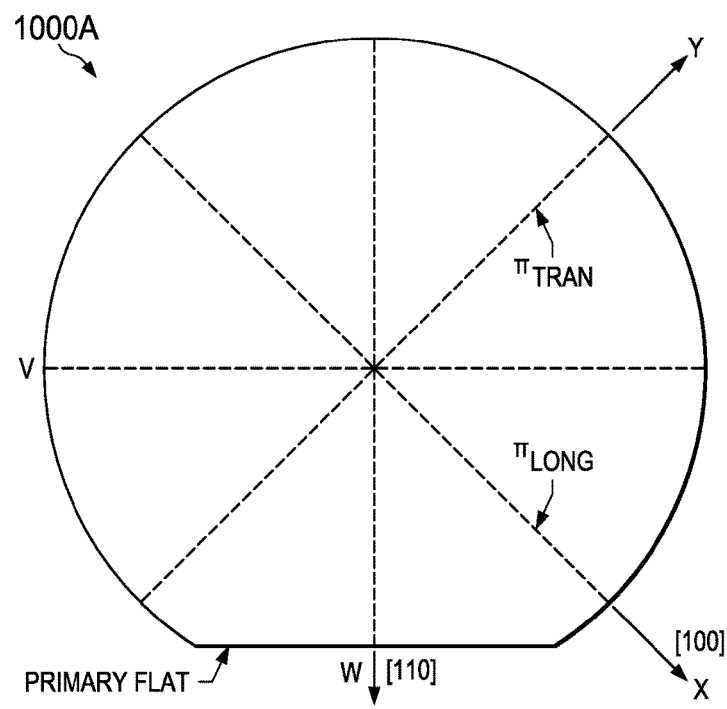
FIG. 10A depicts the crystal axes of a {100} p-type wafer and the orientation of the X-Y axis on the wafer as utilized in an embodiment of the disclosure.
Figure 10B:
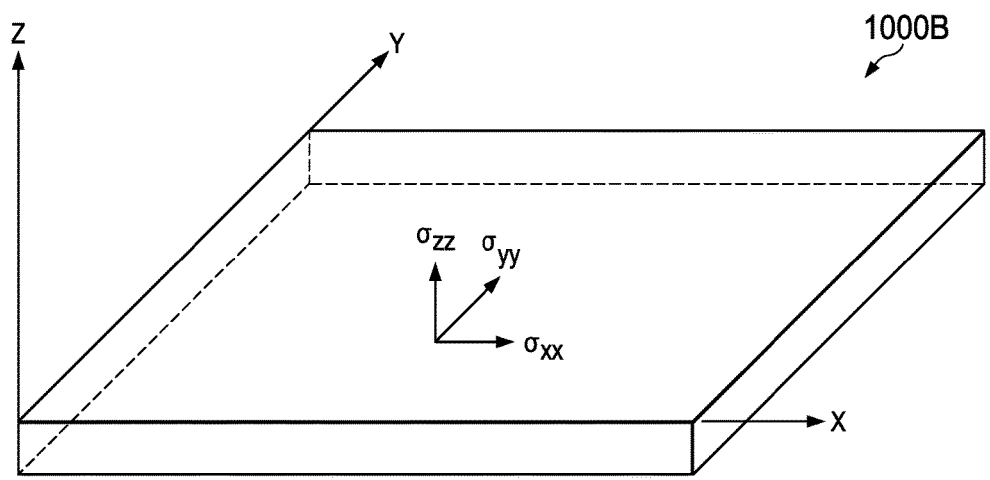
FIG. 10B depicts three-dimensional axes with relationship to the wafer plane and the stress vectors of interest according to an embodiment of the disclosure.

As mentioned previously, mechanical stress affects various parameters of at least some semiconductor elements in ways that depend on the relative orientation of the element with regard to the crystal structure of a semiconductor substrate. With reference first to FIGS. 10A and 10B, the direction designations used in the present application are shown. A semiconductor wafer, e.g., a silicon wafer, is sawn from a single crystal rod such that the wafer surface is associated to a crystallographic plane. In order to determine the respective plane in a cubic crystal, the so called "Miller indices" are used, which are indicated by curly brackets. FIG. 10A depicts a top view of a p-type semiconductor wafer that is cut in the {100} plane and provided with a "primary flat". Although not a limitation, unless otherwise stated, the examples provided herein utilize p-type semiconductor wafers cut in the {100} plane.

In FIG. 10A, four crystallographic directions or axes, V, W, X, Y, are illustrated in the plane of the semiconductor wafer 1000A. The W axis runs perpendicular to the primary flat and coincides with the [110] crystal axis, while the V axis runs parallel to the primary flat. Normally, the edges of the square geometries within the circuit structures run on the semiconductor chip in parallel or perpendicular to the primary flats. The X axis runs at an angle of 45 degrees to the [110] crystal axis and coincides with the [100] crystal axis, while the Y axis runs at an angle of 90 degrees to the X axis. The disclosed embodiments of stress sensing elements are generally described in reference to the [100] crystal axis, although this should not be taken as a limiting factor. The piezo-resistive coordinates that correspond to the X and Y axes reflect the sensitivity of the resistance to stress and are referred to herein by the Greek letter, π. Stresses that occur along the X axis are referred to herein as occurring longitudinal to the [100] crystal axis and have a piezo-resistive coordinate of $\pi_{Long}$, while stresses that occur along the Y axis are referred to as occurring transverse to the [100] crystal axis and have a piezo-resistive coordinate of $\pi_{Tran}$.

FIG. 10B illustrates a three-dimensional section of a semiconductor wafer 1000B and shows the Cartesian coordinates. The X and Y axes run in the plane of the semiconductor wafer and correspond to the X and Y axes illustrated in FIG. 10A, while the Z axis runs perpendicular to the plane of the semiconductor wafer. Stresses that occur on the semiconductor wafer 1000B are designated by the symbol σ. Stress is not a scalar value but a tensor value having six components: three normal stresses, shown as $\sigma_{XX}$, $\sigma_{YY}$, $\sigma_{ZZ}$ and three shear stresses $\sigma_{XY}$, $\sigma_{XZ}$, $\sigma_{YZ}$ (not specifically shown). While it is not typically sufficient to measure only a single stress component, because all circuit elements are typically affected by at least two stress components, the fact that a packaged integrated circuit chip is generally structured in a layered manner permits a limitation to measuring either only the two stress components that lie in the plane of the wafer, i.e. $\sigma_{XX}$, $\sigma_{YY}$, or else measuring all of the three stress components shown in FIG. 10B, i.e., $\sigma_{XX}$, $\sigma_{YY}$, $\sigma_{ZZ}$. The remaining stress components are essentially negligibly small and only have a minor influence on the electronic circuit components.

Figure 11:
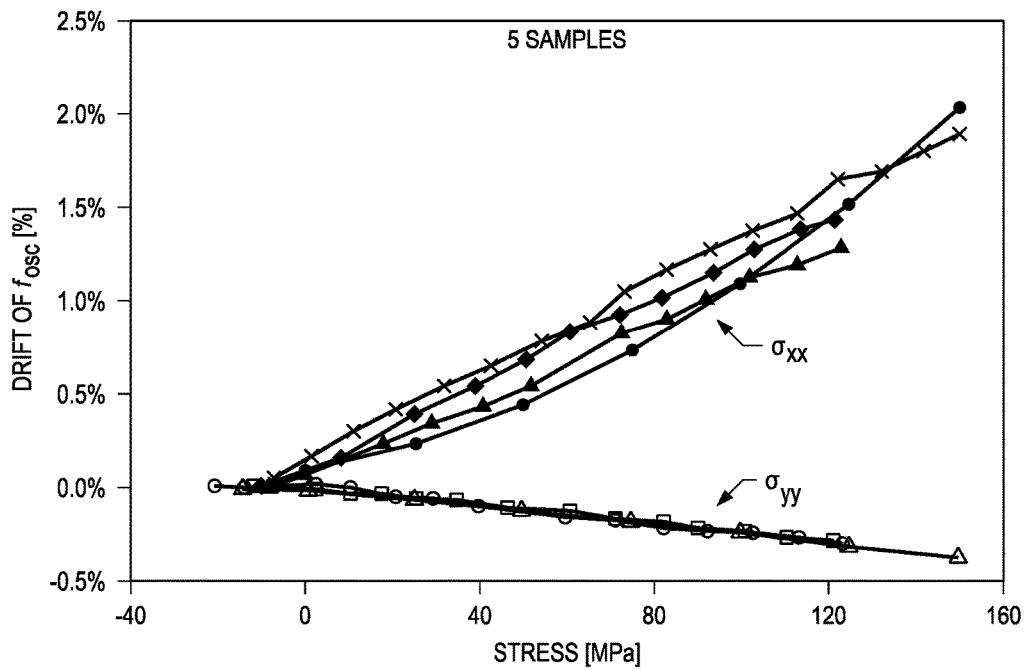
FIG. 11 depicts the output frequency of an RC-relaxation oscillator as the frequency of the oscillator responds to stress along two orthogonal axes.

FIG. 11 is from the reference, "Electrical Compensation of Mechanical Stress Drift in Precision Analog Circuits", M. Motz, U. Ausserlechner, Springer, 2016, and demonstrates the percentage drift in output frequency of a resistor/capacitor (RC)-relaxation oscillator as stress is applied to the chip on which the oscillator is implemented. This figure demonstrates the differences in response to stress in two orthogonal directions. In this example, it can be seen that stress along the X-axis, i.e., $\sigma_{XX}$, causes a much larger shift in the frequency of the oscillator than stress along the Y-axis, i.e. $\sigma_{YY}$. Additionally it can be noted that $\sigma_{XX}$ causes an increase in output frequency, while $\sigma_{YY}$ causes a decrease in output frequency. The magnitude of these responses is dependent on the orientation of the semiconductor elements, as well as the type and level of doping used to form the semiconductor elements.

Table 1 below, which is excerpted from the reference "Piezoresistance Effect in Germanium and Silicon", C. S. Smith, Phys. Rev., Vol. 94, pp. 42-49, 1954, provides the piezo-electric coefficients associated with typical doping types, doping levels and orientation of the elements for resistors utilized in standard CMOS processing for the piezo-electric material silicon. The disclosed embodiments can also be utilized with other opto-electric material if they display opposite signs with regard to stress sensitivity for two separate crystal orientations.

TABLE 1

| | Stress Sensitivity (Pa$^{-1}$) | |
|---|---|---|
| | Resistor | |
| Orientation | N-Type | P-Type |
| Longitudinal to <100> | −102e$^{−11}$ | 6.6e$^{−11}$ |
| Transverse to <100> | 53.4e$^{−11}$ | −1.1e$^{−11}$ |
| Longitudinal to <110> | −31.6e$^{−11}$ | 71.8e$^{−11}$ |
| Transverse to <110> | −17.6e$^{−11}$ | −66.3e$^{−11}$ |

The disclosed method of sensing stress relies on pairs of longitudinal and transverse piezo-resistive coefficients that have opposite polarities. In the disclosed embodiments, N-type resistors that are longitudinal and transverse to the <100> axis have been selected as examples in the present application and their piezo-resistive coefficients are shown in bold in Table 1. N-type resistors that are longitudinal and transverse to the <110> axis both have negative polarities and are therefore not suitable for use in the disclosed embodiments, although P-type resistors that are aligned either longitudinal and transverse to the <100> axis or else longitudinal and transverse to the <110> axis may be utilized in embodiments of the disclosure.

Figure 1A:
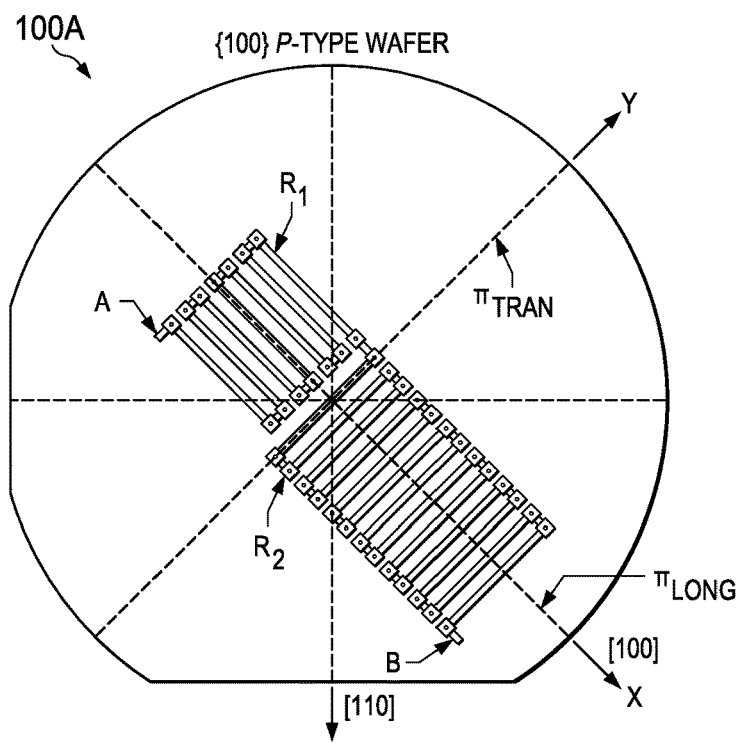
FIG. 1A depicts an example of a stress sensing element that provides a stress component transverse to the [100] crystal axis according to an embodiment of the disclosure.

Turning to FIG. 1A, a first stress sensing element 100A is shown that is configured to provide a value that is proportional to stress component $\sigma_{XX}$. Stress sensing element 100A is an N-type stress sensing element and in a complementary metal oxide silicon (CMOS) process will typically contain either N-well resistors or N-type source/drain (NSD) resistors, although other types of resistors can also be utilized in the disclosed process. In an alternate embodiment, stress sensing element 100A utilizes P-type resistors and uses the piezo-resistive coefficients corresponding to P-type resistors in the equations discussed below. In the embodiment shown, resistors $R_1$, $R_2$ are aligned so that the major direction of current flow through each of resistors $R_1$, $R_2$ is either longitudinal or transverse to the <100> crystal axis. It will be noted that the resistors can also be oriented to provide a major direction of flow that is either longitudinal or transverse to the <110> crystal axis, but that the present orientation and doping have been selected as providing the greatest difference in the piezo-resistive coefficients associated with the respective resistors.

Figure 1B:
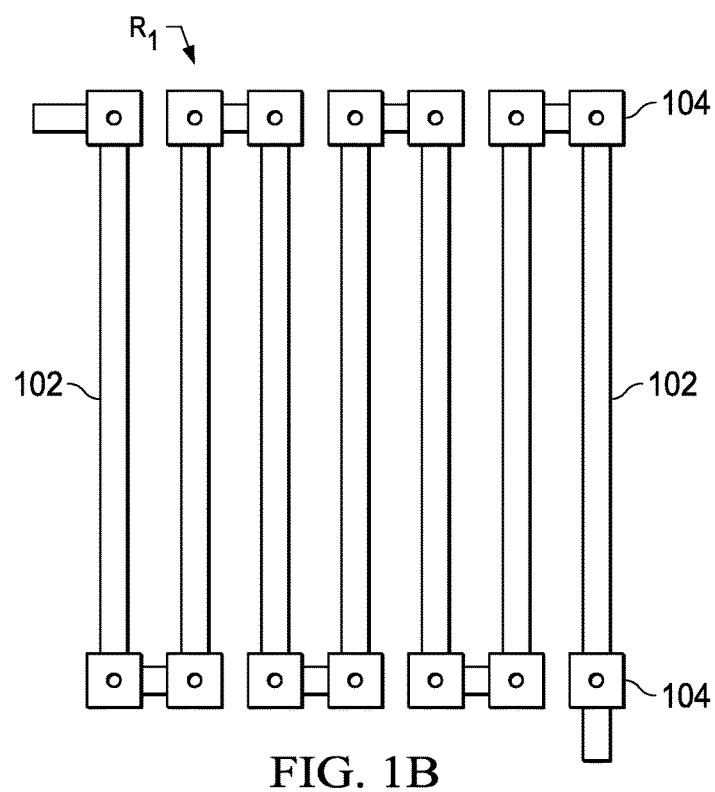
FIG. 1B depicts an example of a resistor that can be part of a stress sensing element according to an embodiment of the disclosure.

FIG. 1B depicts an example of resistor $R_1$ of stress sensing element 100 in order to describe the structures of an example resistor that amplifies sensitivity to a single piezo-resistance coefficient. Resistor $R_1$ is typically formed by implanting a low dose of N-type dopants into a number of resistor strips 102 that are aligned either longitudinal or transverse to a desired crystal axis and provide a substantially constant resistance along the length of resistor strips 102. Resistor strips 102 are joined by low-resistance connectors 104 that conduct the current in a direction that is substantially perpendicular to the desired axis but add little in the way of resistance so that the overall resistance of resistor $R_1$ is dependent on the orientation of resistor strips 102; it will be understood that the other resistors shown in the figures can be constructed in a similar fashion or using any other techniques that predominantly provide resistance along a desired axis.

Returning to FIG. 1A, resistor $R_1$ is oriented so that the major direction of current flow in $R_1$ is longitudinal to the <100> crystal axis and resistor $R_2$ is oriented so that the major direction of current flow in $R_2$ is transverse to the <100> crystal axis. For N-type resistors implemented in silicon and oriented to the [100] crystal axis, the longitudinal piezo-resistive coefficient, $\pi_{Long}$, is −102.2%/GPa and the transverse piezo-resistive coefficient, $\pi_{Tran}$, is 53.4%/GPa. The following two equations apply:

$$\Delta R_{Long} = R \cdot (\pi_{Long} \cdot \sigma_{XX} + \pi_{TRAN} \cdot \sigma_{YY}) \quad \text{Equation 1}$$

$$\Delta R_{TRAN} = R \cdot (\pi_{TRAN} \cdot \sigma_{XX} + \pi_{LONG} \cdot \sigma_{YY}) \quad \text{Equation 2}$$

where $\Delta R_{Long}$ is the change in resistance along the y-axis, $\Delta R_{TRAN}$ is the change in resistance along the x-axis shown in FIG. 1A, and R is the resistance in the resistor when no stress is applied. Assuming that resistor $R_1$ and resistor $R_2$ are similarly doped and have similar widths, then in one embodiment the ratio between the length of resistor $R_1$ and the length of resistor $R_2$, e.g. $L_{R1}/L_{R2}$, is designed to be equal to a value, α, that is equal to $\pi_{Tran}/\pi_{Long}$, which in the illustrated example is 53.4/102.2 or about 0.52. As seen in FIG. 1A, resistors $R_1$ and $R_2$ are coupled in series between node A and node B, which can then be coupled (not specifically shown) to provide a current through stress sensing element 100A. Since the resistance for resistors coupled in series can be expressed as a sum of the individual resistances, the resistance along the X-axis for stress sensing element 100A can then be stated as:

$$\Delta R_{XX} = \alpha \cdot \Delta R_{LONG} + \Delta R_{TRAN} \quad \text{Equation 3}$$

By selecting the value of $\alpha$ to reflect the ratio between $\pi_{Tran}$ and $\pi_{Long}$, the value of $\sigma_{YY}$ is mathematically cancelled, so that $\Delta R_{XX}$ becomes proportional to $\sigma_{XX}$. When the disclosed embodiment is implemented in silicon, $$\Delta R_{XX} = R \cdot (2.914 - 140.78 \, e^{-11} \, Pa^{-1} \cdot \sigma_{XX}) \quad \text{Equation 4}$$

Figure 1C:
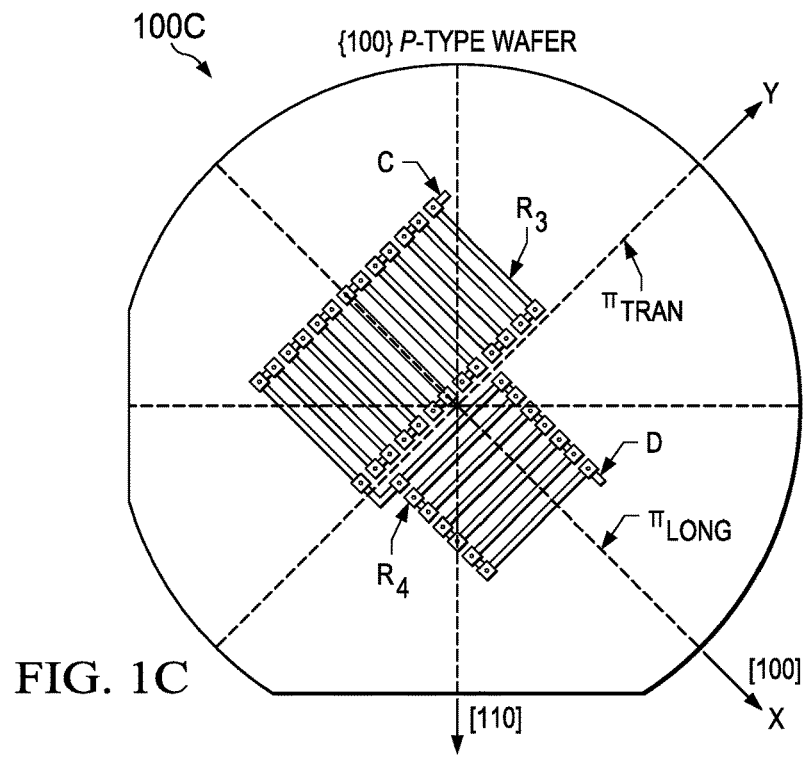
FIG. 1C depicts an example of a stress sensing element that provides a stress component longitudinal to the [100] crystal axis according to an embodiment of the disclosure.

FIG. 1C depicts a second stress sensing element 100C that is configured to provide a value that is proportional to stress component $\sigma_{YY}$. Stress sensing element 100C is again an N-type stress sensing element and will typically contain either N-well resistors or NSD resistors in correspondence to the resistor type selected for stress sensing element 100A. Resistors $R_3$, $R_4$ are again aligned so that the major direction of current flow through each of resistors $R_3$, $R_4$ is either longitudinal or transverse to the <100> crystal axis. Resistor $R_3$ is an N-type resistor whose major direction of flow is longitudinal to the <100> crystal axis and resistor $R_4$ is an N-type resistor whose major direction of flow is transverse to the <100> crystal axis. As in the previous example, the resistors can also be oriented to provide a major direction of flow that is either longitudinal or transverse to the <110> crystal axis or P-type resistors can be utilized with appropriate change of piezo-resistive coefficients. The difference between FIG. 1A and FIG. 1C is that the ratio between resistors $R_3$, $R_4$ is the inverse of the ratio between resistors $R_1$, $R_2$, i.e., in the disclosed embodiment the $L_{R3}/L_{R4}$ is equal to $\pi_{Long}/\pi_{Tran}$.

Stress sensing element 100C has the same doping and orientation as stress sensing element 100A and resistors $R_3$ and $R_4$ are coupled in series between node C and node D, which are coupled (not specifically shown) to provide a current through stress sensing element 100C. Equations 1 and 2 above continue to apply. The resistance along the Y-axis for stress sensing element 100C can then be expressed as:

$$\Delta R_{YY} = \Delta R_{Long} + \alpha \cdot \Delta R_{TRAN} \quad \text{Equation 5}$$

In this equation, the value of $\sigma_{XX}$ is mathematically cancelled, so that $\Delta R_{YY}$ is proportional to the stress along the Y-axis, $\sigma_{YY}$. When the disclosed embodiment is implemented in silicon, $$\Delta R_{YY} = R(2.914 - 140.78 \, e^{-11} \, Pa^{-1} \cdot \sigma_{YY}) \quad \text{Equation 6}$$

As has been shown, the disclosed embodiments provide a simple method of directly sensing the stress components in both longitudinal and transverse orientations to a selected crystal axis, simply by implementing stress sensing elements 100A and 100C.

Figure 2A:
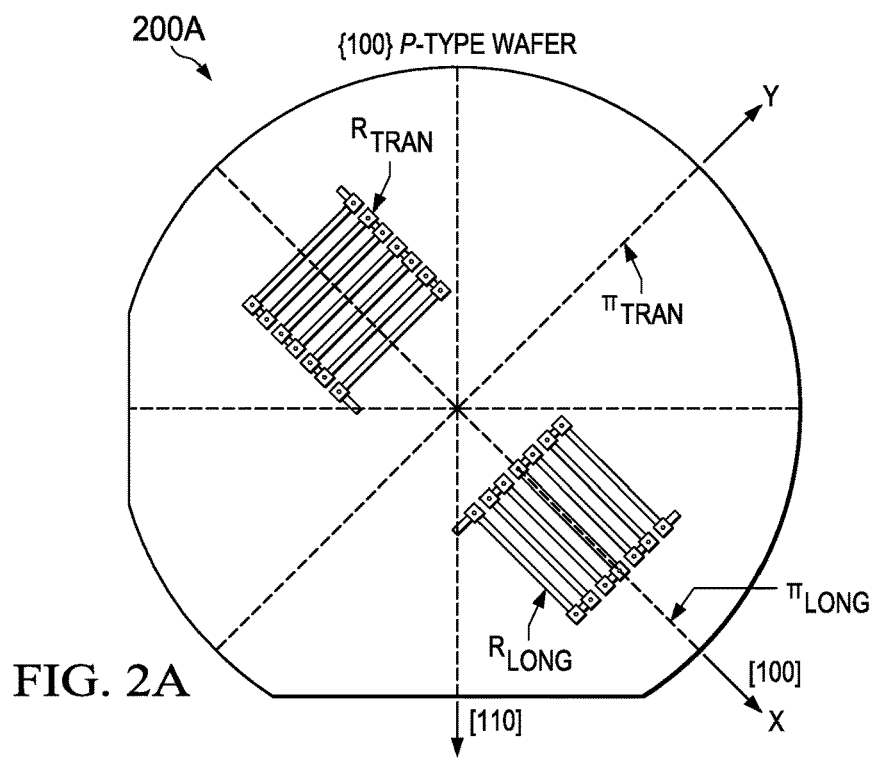
FIG. 2A depicts two resistors that can be utilized to form a stress sensing element to determine stress components longitudinal and transverse to the [100] crystal axis according to an embodiment of the disclosure.
Figure 2B:
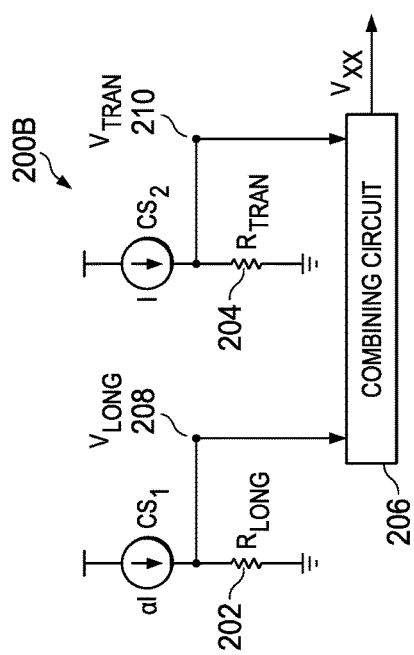
FIG. 2B depicts a circuit in which the two resistors of FIG. 2A can be utilized to form a stress sensing element to determine stress components transverse to the [100] crystal axis according to an embodiment of the disclosure.
Figure 2C:
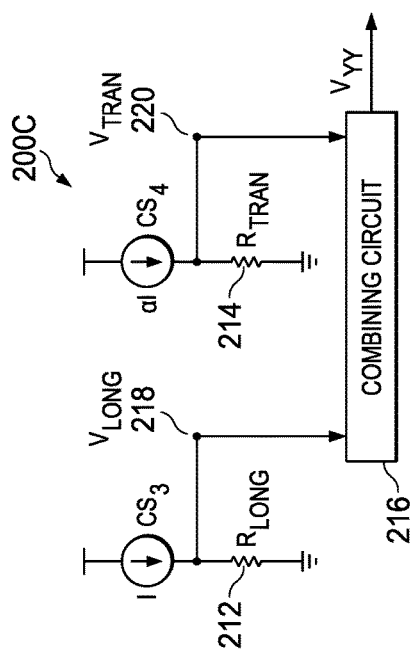
FIG. 2C depicts a circuit in which the two resistors of FIG. 2A can be utilized to form a stress sensing element to determine stress components longitudinal to the [100] crystal axis according to an embodiment of the disclosure.

Stress sensing elements 100A, 100C utilize the value $\alpha$ to determine the ratio of resistance between resistors $R_1$ and $R_2$ and between resistors $R_3$ and $R_4$ to cancel out one of the stress components. FIGS. 2A-2C depict an alternate embodiment in which the value $\alpha$ is used to set a ratio of currents driven through the separate resistors that have the same resistance. FIG. 2A depicts a set 200A of resistors $R_{TRAN}$ and $R_{LONG}$ that can be utilized to form a sensing element. Set 200A contains resistor $R_{TRAN}$, which is oriented to conduct current primarily in the transverse direction, and resistor $R_{LONG}$, which is oriented to conduct current primarily in the longitudinal direction. However, rather than being coupled in series as were the embodiments of stress sensing elements 100A, 100C, resistors $R_{TRAN}$ and $R_{LONG}$ are utilized in the circuits shown in FIG. 2B and FIG. 2C.

In stress sensing element 200B, resistor $R_{LONG}$ 202 is coupled between a first current source $CS_1$ and a lower rail; the voltage $V_{LONG}$ 208 is taken from a point between current source $CS_1$ and resistor $R_{LONG}$ 202. Similarly, resistor $R_{TRAN}$ 204 is coupled between a second current source $CS_2$ and the lower rail; the voltage $V_{TRAN}$ 210 is taken from a point between current source $CS_2$ and $R_{TRAN}$ 204. As seen in FIG. 2B, the current provided by current source $CS_2$ is equal to the value I and the current provided by current source $CS_1$ is equal to $\alpha \cdot I$. The voltages $V_{LONG}$ 208 and $V_{TRAN}$ 210 are provided to a first combining circuit 206, which adds the values of $V_{LONG}$ and $V_{TRAN}$ to obtain a voltage $V_{XX}$ that is proportional to the component of stress transverse to the respective crystal axis to which the resistors are oriented. Combining circuit 206 can be implemented with a switched capacitor circuit, which is known to those skilled in the art and is not further explained herein. The following equations apply:

$$\Delta V_{LONG} = I_1 \cdot \Delta R_{LONG} = (\alpha \cdot I_2) \cdot \Delta R_{LONG} \quad \text{Equation 7}$$

$$\Delta V_{TRAN} = I_2 \cdot \Delta R_{TRAN} \quad \text{Equation 8}$$

Stress sensing element 200B can determine the component of stress in the x-direction using the following equation:

$$\Delta V_{XX} = \Delta V_{LONG} + \Delta V_{TRAN} = (\alpha \cdot \Delta R_{LONG} + \Delta R_{TRAN}) \cdot I_2 \quad \text{Equation 9}$$

In stress sensing element 200C, resistor $R_{LONG}$ 212 is coupled between a third current source $CS_3$ and the lower rail; the voltage $V_{LONG}$ 218 is taken from a point between current source $CS_3$ and resistor $R_{LONG}$ 212. Similarly, resistor $R_{TRAN}$ 214 is coupled between a fourth current source $CS_4$ and the lower rail; the voltage $V_{TRAN}$ 220 is taken from a point between current source $CS_4$ and $R_{TRAN}$. As seen in FIG. 2C, the current provided by current source $CS_3$ is equal to the value I and the current provided by current source $CS_4$ is equal to $\alpha \cdot I$. The voltages $V_{LONG}$ 218 and $V_{TRAN}$ 214 are provided to a second combining circuit 216, which adds the values of $V_{LONG}$ 218 and $V_{TRAN}$ 220 to obtain a voltage $V_{YY}$ that is proportional to the component of stress longitudinal to the respective crystal axis. Combining circuit 216 can again be implemented with switched capacitor circuits. The following equations apply:

$$\Delta V_{LONG} = I_2 \cdot \Delta R_{LONG} \quad \text{Equation 10}$$

$$\Delta V_{TRAN} = I_1 \cdot \Delta R_{TRAN} = (\alpha \cdot I_2) \cdot \Delta R_{TRAN} \quad \text{Equation 11}$$

Stress sensing element 200C can determine the component of stress in the y-direction using the following equation:

$$\Delta V_{YY} = \Delta V_{LONG} + \Delta V_{TRAN} = (\Delta R_{LONG} + \alpha \cdot \Delta R_{TRAN}) \cdot I_2 \quad \text{Equation 12}$$

Figure 3A:
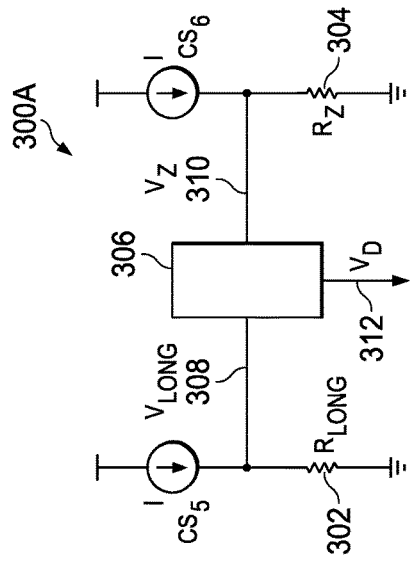
FIG. 3A depicts a circuit in which one of the resistors of FIG. 2A can be utilized in conjunction with a vertical resistor to form a stress sensing element to determine stress components transverse to the [100] crystal axis according to an embodiment of the disclosure.
Figure 3B:
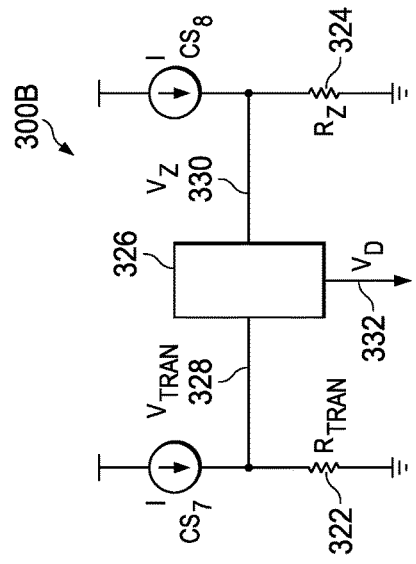
FIG. 3B depicts a circuit in which one of the resistors of FIG. 2A can be utilized in conjunction with a vertical resistor to form a stress sensing element to determine stress components longitudinal to the [100] crystal axis according to an embodiment of the disclosure.

A third embodiment of stress sensing elements 300A, 300B is depicted in FIGS. 3A and 3B, in which one resistor in each set of resistors is implemented in the z-direction. This third embodiment again utilizes resistors coupled between a current source and the lower rail, but does not rely on a relationship between the current flow that is based on $\alpha$. Each of the current sensors in this embodiment provides a current I to a respective resistor. Stress sensing element 300A contains resistor $R_{LONG}$ 308, which is coupled between a current source $CS_5$ and the lower rail; current source $CS_5$ provides a current I. Stress sensing element 300A contains resistor $R_Z$ 304, which is oriented to conduct current primarily in the z-direction and is coupled between current source $CS_6$ and the lower rail; current source $CS_6$ also provides a current I. Each of voltage $V_{LONG}$ 308, which is taken from a point between current source $CS_5$ and resistor $R_{LONG}$ 302, and voltage $V_Z$ 310, which is taken from a point between current source $CS_6$ and resistor $R_Z$ 304, is provided to difference circuit 306. Difference circuit 306 provides voltage $V_D$ 312, which is the difference between $V_{LONG}$ 308 and $V_Z$ 310. Equations 1 and 2 are relevant in this embodiment; the following equation also applies:

$$\Delta R_Z = R \cdot (\pi_{TRAN} (\sigma_{XX} + \sigma_{YY})) \quad \text{Equation 13}$$

The relationship expressed in Equation 13 can be set by adjusting the respective lengths of the resistors. The component of stress in the x-direction becomes:

$$\Delta R_{XX} = \Delta R_{LONG} - \Delta R_Z \quad \text{Equation 14}$$

When implemented in silicon, Equation 14 becomes:

$$\Delta R_{XX} = R(-155.6e^{-11} Pa^{-1} \cdot \sigma_{XX}) \quad \text{Equation 15}$$

Similarly, stress sensing element 300B contains resistor $R_{TRAN}$ 322, which is coupled between a current source $CS_7$ and the lower rail; current source $CS_7$ provides a current I. Stress sensing element 300B also contains resistor $R_Z$ 324, which is oriented to conduct current primarily in the z-direction and is coupled between current source $CS_8$ and the lower rail; current source $CS_8$ also provides a current I. Each of voltage $V_{TRAN}$ 328, which is taken from a point between current source $CS_7$ and resistor $R_{TRAN}$ 322, and voltage $V_Z$ 330, which is taken from a point between current source $CS_8$ and resistor $R_Z$ 324, is provided to difference circuit 326. Difference circuit 326 provides voltage $V_D$ 332, which is the difference between $V_{TRAN}$ and $V_Z$. Using Equations 1, 2 and 13, the component of stress in the y-direction becomes:

$$\Delta R_{YY} = \Delta R_{TRAN} - \Delta R_Z \quad \text{Equation 16}$$

When implemented in silicon, Equation 16 becomes:

$$\Delta R_{YY} = R(-155.6e^{-11} Pa^{-1} \cdot \sigma_{YY}) \quad \text{Equation 17}$$

Figure 4:
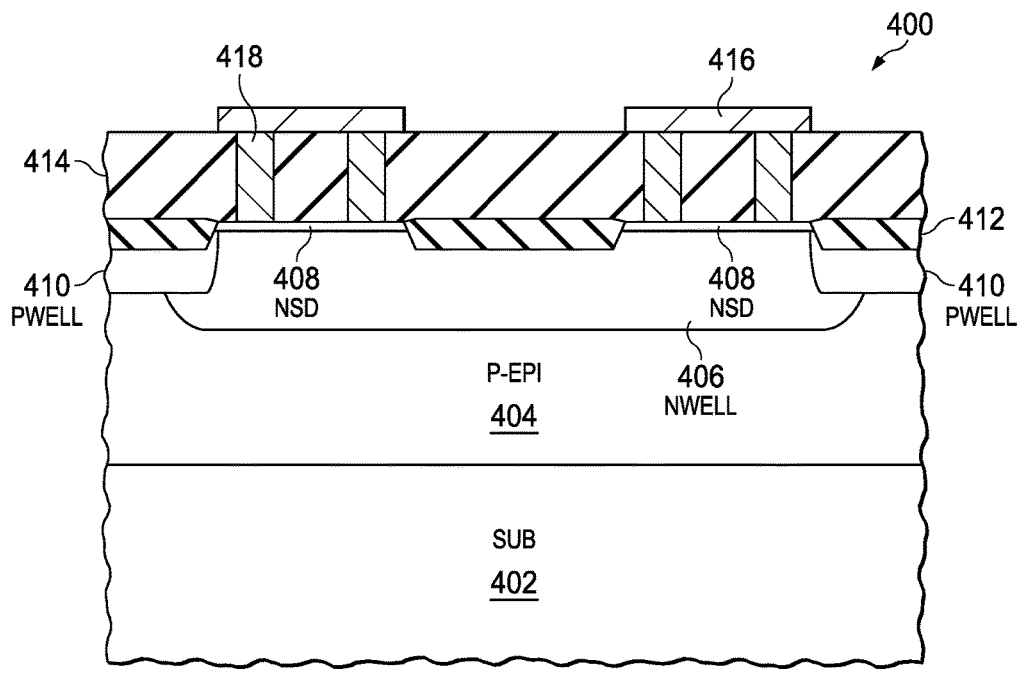
FIGS. 4 and 5 depict example lateral resistors that can be implemented in the disclosed embodiments.
Figure 5:
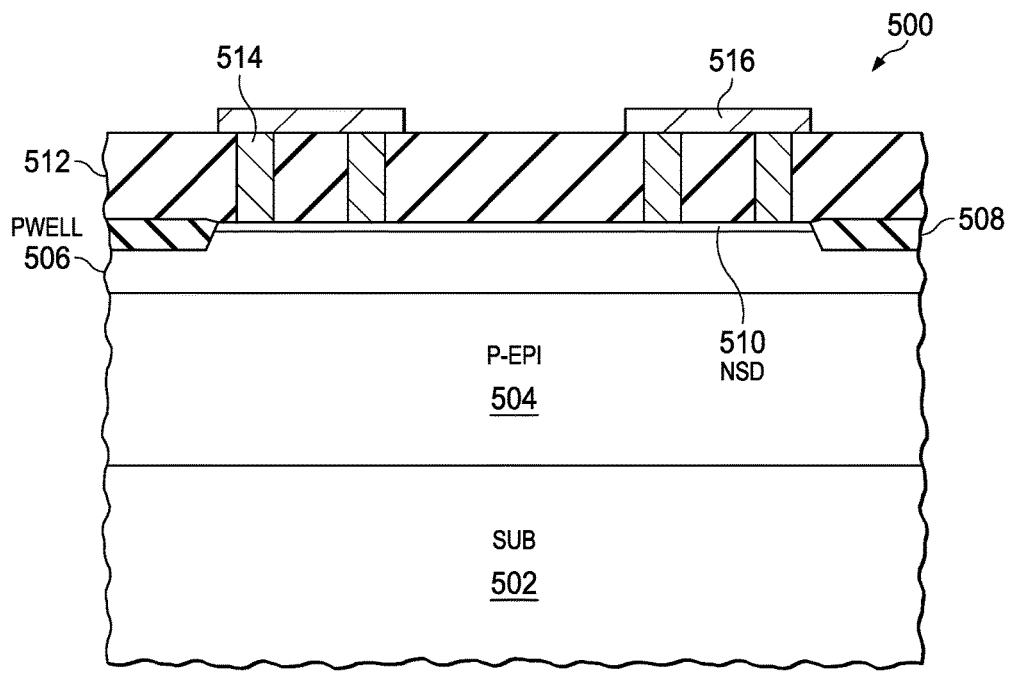

FIGS. 4 and 5 depict two example resistors that can be utilized to implement the resistors that are oriented either longitudinal or transverse to the crystal axis, i.e., resistors $R_1$, $R_2$, $R_3$, $R_4$, $R_{LONG}$ and $R_{TRAN}$. FIG. 4 depicts an N-well resistor 400, although resistor 400 can also be implemented as a P-well resistor. In this example embodiment, substrate 402 has an epitaxial layer 404 grown thereon. An N-well region 406 is implanted and P-well regions 410 are implanted adjacent N-well 406 to provide isolation, then N-type source/drain implants 408 are implanted to form contact regions for the resistor 400. Shallow trench isolation 412 provides additional isolation from adjacent structures. After the deposition of inter-level dielectric 414, contacts 418 are formed to the endpoints of the resistors and metallization layer 416 is formed to couple the resistor 400 to other structures. In at least one embodiment, N-well 406 is utilized to form each of the resistor strips 102 shown in FIG. 1B, while metallization layer 416 forms the low-resistance connectors 104 that couple the resistors strips 102 to each other, as well as to other components. The advantages of the N-well and P-well resistors include higher sensitivity and a higher sheet resistance. Disadvantages may include a temperature dependence of the resistivity and a higher temperature dependence of the sensitivity of the piezo-resistive coefficients.

FIG. 5 depicts an N-type source/drain (NSD) resistor 500, although this structure can also be utilized to form a P-type source/drain (PSD) resistor according to an embodiment of the disclosure. In the depicted embodiment, epitaxial layer 504 is grown on substrate 502 and a P-well 506 is implanted on the surface of epitaxial layer 504 for isolation. Shallow-trench isolation 508 provides separation from adjacent structures. An N-type source/drain implant forms conducting region 510. After deposition of inter-level dielectric 512, vias 514 are formed to contact the endpoints of the resistor and metallization layer 516 is deposited and patterned to couple resistor 500 to other structures. Metallization layer 516 can also be utilized to form the low-resistance connectors 104 as previously discussed. Advantages of NSD or PSD resistors can include a lower temperature dependence of the piezo-resistive coefficients, while the disadvantages can include lower sensitivity and a lower sheet resistance.

Figure 6A:
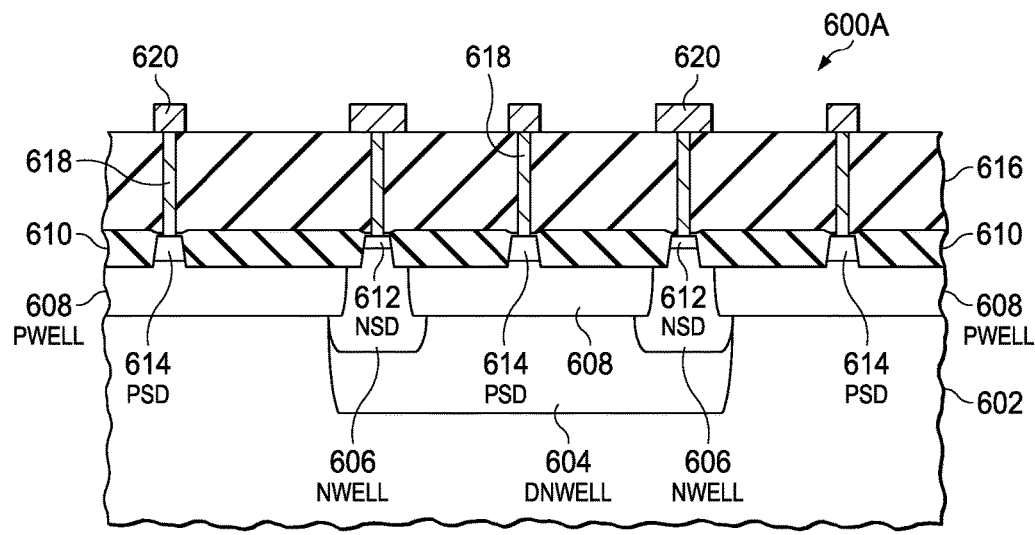
FIGS. 6A and 6B depict example vertical resistors that can be implemented in the disclosed embodiments.
Figure 6B:
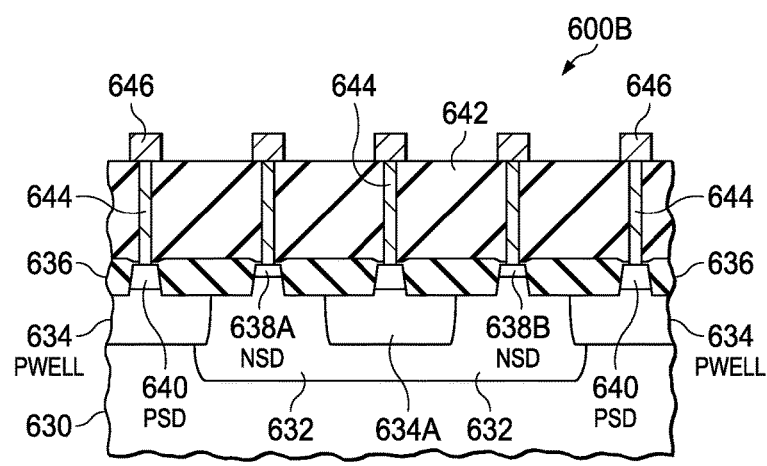

FIGS. 6A and 6B depict two example vertical resistors that can be utilized to implement a vertical resistor in the disclosed embodiments, e.g., $R_Z$ 310, 324. Resistor 600A is an N-type resistor, although resistor 600A can also be implemented as a P-type resistor. A deep N-well 604 is implanted into P-type substrate 602, which can include an epitaxial layer (not specifically shown). The deep N-well 604 forms a buried layer. N-wells 606 are implanted into the surface of substrate 602 to contact opposite ends of deep N-well 604, followed by the implantation of P-wells 608. Dielectric layer 110 is then formed to cover the surface of substrate 602. Contact regions 612 are implanted in N-well regions 606 and contact regions 614 are implanted in P-well regions 608. The deposition of inter-level dielectric 616 is followed by the formation of vias 618 to N-type contact regions 612 and P-type contact regions 614, followed by the formation of metallization layer 620. By appropriately setting the doping of the buried layer formed by deep N-well 604 to be heavier than the doping of N-well regions 606, the horizontal resistance in resistor 600A is minimized and the resistance is primarily vertical.

Resistor 600B is a second example of a resistor 600B that can be utilized as a vertical transistor in the disclosed embodiments. Resistor 600B is again implemented as an N-type resistor, but can also be implemented as a P-type resistor. In this embodiment, substrate 630 is P-type and can contain an epitaxial layer (not specifically shown). An N-well region 632 is implanted in substrate 630, as are P-well regions 634. After the formation of dielectric layer 636, N-type contact regions 638A, 638B are formed in two regions of N-well 632 that are separated by P-well 634A; P-type contact regions 640 are also formed in P-wells 634. Inter-level dielectric 642 is then deposited, followed by the formation of vias 644 to each of contact regions 638, 640 and metallization layer 646. By forcing the flow of current between contacts 638A and 638B to flow vertically to overcome the presence of P-well 634A and by minimizing the horizontal distance between contacts 638A, 638B, a resistor 600B whose primary resistance is in the vertical direction can be realized. It will be understood that the drawings, and specifically the drawings of these resistors 600, are not necessarily drawn to scale.

Figure 7A:
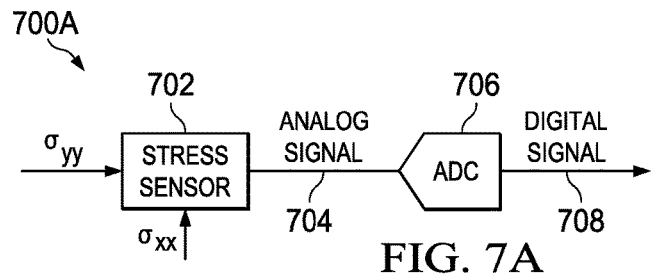
FIG. 7A depicts a high-level example of a stress sensor that provides digital stress information according to an embodiment of the disclosure.

FIG. 7A depicts a high-level example of a stress sensor 700A that provides digital stress information according to an embodiment of the disclosure. Stress sensor 702 receives values for stress components $\sigma_{XX}$, $\sigma_{YY}$ from the disclosed resistor pairs (not specifically shown) and provides an analog signal 704 to analog-to-digital converter (ADC) 706, which then provides digital signal 708. This digital signal can be utilized for many purposes, such as pressure measurements in robotics, for medical Implants such as synthetic skin, and to compensate for the impact of stress on integrated circuits.

Figure 7B:
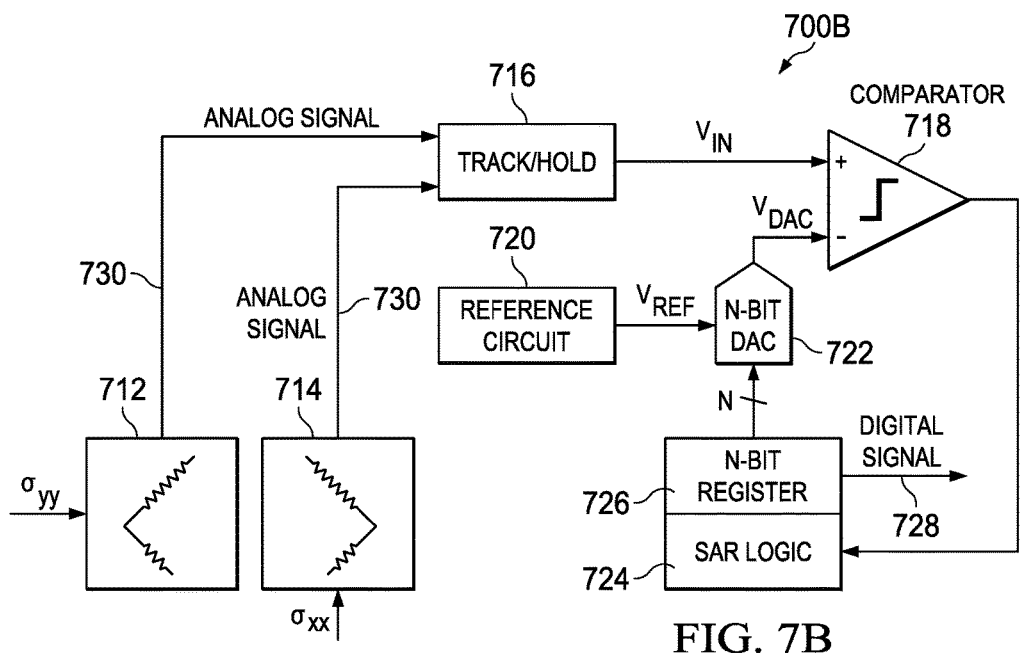
FIG. 7B depicts an example implementation of the circuit of FIG. 7A according to an embodiment of the disclosure.

FIG. 7B depicts an example implementation of the circuit of FIG. 7A according to an embodiment of the disclosure. Circuit 700B contains two resistor pairs coupled in series that provide analog signals 730. Resistor pair 712 determines the value of $\sigma_{YY}$ and can correspond to any of stress sensing elements 100C, 200C, 300B. Similarly, resistor pair 714 determines the value of $\sigma_{XX}$ and can correspond to any of stress sensing elements 100A, 200B, 300A. Analog signals 730 are provided to a track and hold circuit 716 that provides a voltage $V_{IN}$ to the non-inverting input of comparator 718. N-bit digital-to-analog converter (DAC) 722 provides a voltage $V_{DAC}$ to the inverting input of comparator 718. The output of comparator 718 is provided to a successive-approximation-register (SAR) ADC, which includes SAR logic 724 and which converts the comparator value to an N-bit value that is stored in N-bit register 726. The N-bit value is provided as digital signal 728 and is also provided to N-bit DAC 722 as part of a feedback loop. Reference circuit 720 provides a reference voltage $V_{REF}$ to N-bit DAC 722.

Figure 8:
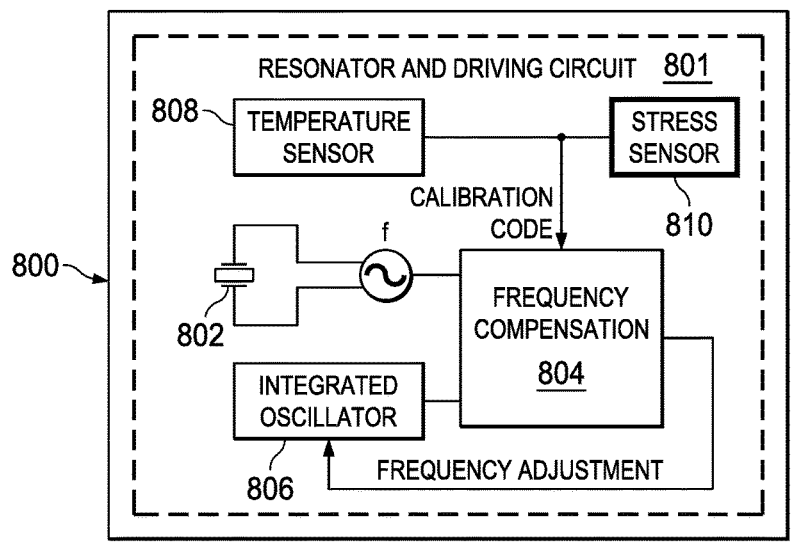
FIG. 8 depicts an example of an IC chip containing a resonator and driving circuit that can incorporate a stress sensor according to an embodiment of the disclosure.

FIG. 8 depicts an IC chip 800 containing a circuit 801 that includes a resonator 802 and driving circuit according to an embodiment of the disclosure. Frequency compensation circuit 804 compares a tuned frequency f from resonator 802 and a second frequency from integrated oscillator 806 and provides a frequency adjustment to integrated oscillator 806. Temperature sensor 808 provides temperature information that can be utilized to stabilize drift of the output frequency due to temperature changes. When a stress sensor 810, such as the disclosed embodiments of stress sensors, are added to circuit 801, stress sensor 810 can be utilized to recalibrate integrated oscillator 806 when stress changes to maintain an accuracy of +/−20 parts per million (ppm), assuming temperature to be constant. Stress sensor 810 can also compensate for the stress caused by packaging, soldering, and board warpage that occurs over the product lifetime.

Figure 9A:
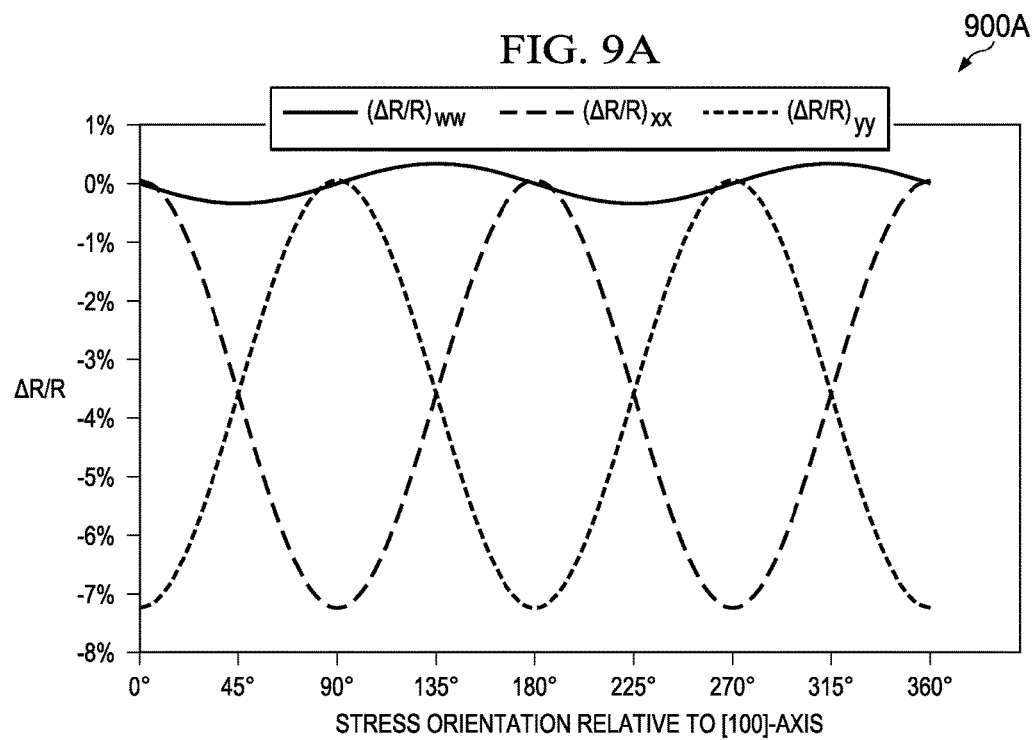
FIG. 9A depicts a graph of the ratio of change in resistance to the original resistance in relation to the stress orientation relative to the [100] crystal axis.
Figure 9B:
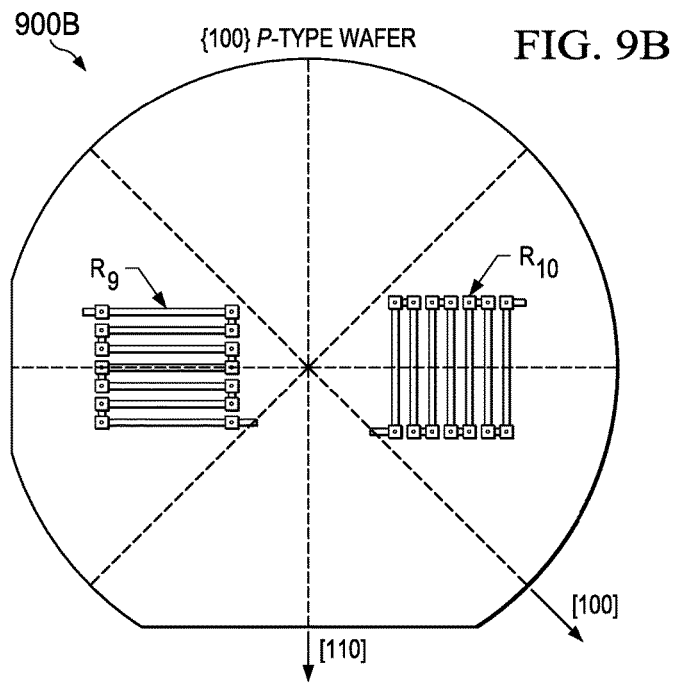
FIG. 9B depicts additional resistors that can be used to provide a distinction between the identical values provided in graph 900A at 45 degrees and at 135 degrees according to an embodiment of the disclosure.
Figure 9C:
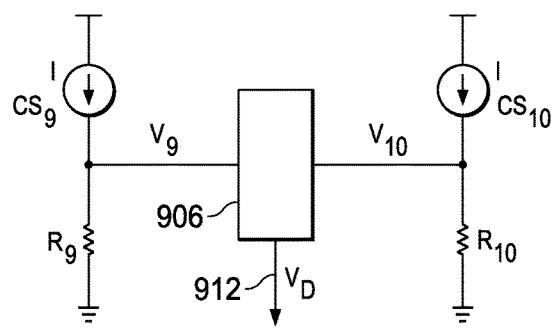
FIG. 9C depicts a circuit in which the resistors of FIG. 9B can be implemented according to an embodiment of the disclosure.

FIG. 9A graphs the ratio of change in resistance to original resistance as the orientation of the stress changes relative to the [100] crystal axis for both the component of stress associated with the X-axis, i.e., $(\Delta R/R)_{XX}$, and the component of stress associated with the Y-axis, i.e., $(\Delta R/R)_{YY}$. From this graph, it can be seen that when the change of resistance is the greatest along the X-axis, the change of resistance is the least along the Y-axis and vice versa. The values for the changes in resistance along the X-axis and along the Y-axis are equal at angles that are offset forty-five degrees from the [100] crystal axis. In applications in which it is important to distinguish between these points having equal values, two additional resistors as shown in FIG. 9B, can be employed. In IC 900B, resistor $R_9$ is oriented to conduct current in a primary direction that is transverse to the [110] crystal axis, which is offset 45 degrees from the [100] crystal axis and resistor $R_{10}$ is oriented to conduct current in a primary direction that is longitudinal to the [110] crystal axis. As shown in FIG. 9C, resistor $R_9$ is coupled between current source $CS_9$ and the lower rail and resistor $R_{10}$ is coupled between current source $CS_{10}$ and the lower rail. Voltage $V_9$ is taken between current source $CS_9$ and resistor $R_9$ and is provided to difference circuit 906; voltage $V_{10}$ is taken between current source $CS_{10}$ and resistor $R_{10}$ and is also provided to difference circuit 906. Difference circuit 906 provides a voltage $V_D$ 912, which provides the difference between voltage $V_9$ and voltage $V_{10}$. A change in voltage $V_D$ 912, i.e., $(\Delta R/R)_{WW}$, provides a waveform that is similar to the other two waveforms in FIG. 9A, but offset by forty-five degrees. The resistance in resistors that are aligned either longitudinal or transverse to the [110] axis varies less than the resistance of resistors aligned longitudinal or transverse to the [100] axis and is also at a maximum or minimum value at the points where $(\Delta R/R)_{XX}$ and $(\Delta R/R)_{YY}$ have the same value. Thus resistors $R_9$ and $R_{10}$ can be utilized to distinguish between the points of similarity.

Applicants have disclosed stress sensing elements that are oriented along and orthogonal relative to a selected crystal axis. In one embodiment, the stress sensing elements are resistors oriented along and orthogonal to the [100] crystal axis. In this embodiment, the resistors can be either N-type or P-type resistors. In one embodiment, the stress sensing elements are resistors oriented along and orthogonal to the [110] crystal axis; in this embodiment, the resistors are P-type resistors. The disclosed stress sensing elements can be designed to cancel out an undesired stress component in each stress sensing element by choosing the values of the two resistors that form each stress sensing element. The disclosed stress sensing elements provide direct separation of the stress components without requiring additional circuit components. The stress sensing elements provide equal sensitivity to both of the stress components, which eases information processing in associated compensation circuits. Although examples have not specifically been shown in this application, the disclosed stress components can also be utilized in applications that provide feedback of stress, e.g., in robotics or medical implants, such as synthetic skin.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. An integrated circuit (IC) chip comprising:
    a substrate comprising a piezoelectric material having: a first resistivity coefficient for a first direction longitudinal to a crystal axis; and a second resistivity coefficient for a second direction transverse to the crystal axis, the first and second resistivity coefficients having opposite signs; and
    a stress sensing element formed in the substrate and configured to conduct current, the stress sensing element comprising: a first resistor aligned to conduct the current primarily in the first direction and a second resistor coupled in series with the first resistor and aligned to conduct the current primarily in the second direction;
    a ratio between a resistance of the second resistor and a resistance of the first resistor being proportional to a value α, the value α being equal to a ratio between the first resistivity coefficient and the second resistivity coefficient.

2. The IC chip of claim 1, wherein a change in the current is proportional to a stress component of a stress applied to the IC chip, the stress component being transverse to the crystal axis.

3. The IC chip of claim 1, wherein the stress sensing element is a first stress sensing element, the current is a first current, and the IC chip further comprises a second stress sensing element formed in the substrate and configured to conduct a second current, the second stress sensing element comprising: a third resistor aligned to conduct the second current primarily in the first direction; and a fourth resistor coupled in series with the third resistor and aligned to conduct the second current primarily in the second direction; a ratio between a resistance of the third resistor and a resistance of the fourth resistor being proportional to the value α.

4. The IC chip of claim 3, wherein a change in the second current is proportional to a stress component of the stress applied to the IC chip, the stress component being longitudinal to the crystal axis.

5. The IC chip of claim 4, wherein the IC further comprises a frequency compensation circuit having inputs coupled to respective outputs from the first stress sensing element and the second stress sensing element.

6. The IC chip of claim 5, wherein the IC further comprises an oscillator having inputs coupled to frequency adjustment outputs from the compensation circuit.

7. The IC chip of claim 3, wherein the crystal axis is a first crystal axis, and the IC chip further comprises a third stress sensing element formed in the substrate, the third stress sensing element comprising:
a fifth resistor adapted to be coupled between a first current source and a voltage rail, the fifth resistor aligned to conduct current primarily in a third direction longitudinal to a second crystal axis different from the first crystal axis;
a sixth resistor adapted to be coupled between a second current source and the voltage rail, the sixth resistor aligned to conduct current primarily in a fourth direction transverse to the second crystal axis, a current from the first current source being proportional to a current from the second current source; and
a difference circuit having: a first input adapted to be coupled to a first voltage node between the fifth resistor and the first current source; a second input adapted to be coupled to a second voltage node between the sixth resistor and the second current source; and an output coupled to a third voltage node; the difference circuit configured to make a voltage at the third voltage node proportional to a difference between respective voltages at the first voltage node and the second voltage node.

8. An integrated circuit (IC) chip comprising:
a substrate comprising a piezoelectric material having a first resistivity coefficient for a first direction longitudinal to a crystal axis and a second resistivity coefficient for a second direction transverse to the crystal axis, the first and second resistivity coefficients having opposite signs; and
a stress sensing element formed in the substrate, the stress sensing element comprising
a first resistor adapted to be coupled between a first current source and a voltage rail, the first resistor aligned to conduct current primarily in the first direction;
a first voltage point between the first resistor and the first current source;
a second resistor adapted to be coupled between a second current source and the voltage rail, the second resistor aligned to conduct current primarily in the second direction, a ratio between a current from the first current source and a current from the second current source being proportional to a value α, the value α being equal to a ratio between the second resistivity coefficient and the first resistivity coefficient;
a second voltage point between the second resistor and the second current source; and
a combining circuit configured to add a first voltage at the first voltage point and a second voltage at the second voltage point, and to generate a third voltage responsive to the adding, the third voltage being proportional to a component of stress for the second direction.

9. The IC chip of claim 8, wherein the stress sensing element is a first stress sensing element, the combining circuit is a first combining circuit, and the IC chip further comprises a second stress sensing element formed in the substrate, the second stress sensing element comprising;
a third resistor adapted to be coupled between a third current source and the voltage rail, the third resistor aligned to conduct current primarily in the first direction;
a fourth voltage point between the third resistor and the third current source;
a fourth resistor adapted to be coupled between a fourth current source and the voltage rail, the fourth resistor aligned to conduct current primarily in the second direction, a ratio between a current from the third current source and a current from the fourth current source being proportional to the value α;
a fifth voltage point between the fourth resistor and the fourth current source; and
a second combining circuit configured to add a fourth voltage at the fourth voltage point and a fifth voltage at the fifth voltage point, and to generate a sixth voltage responsive to the adding, the sixth voltage being proportional to a component of stress for the first direction.

10. The IC chip of claim 9, wherein the IC further comprises a frequency compensation circuit having inputs coupled to respective outputs from the first stress sensing element and the second stress sensing element.

11. The IC chip of claim 10, wherein the IC further comprises an oscillator having inputs coupled to frequency adjustment outputs from the compensation circuit.

12. The IC chip of claim 11, wherein the crystal axis is a first crystal axis, and the IC chip further comprises a third stress sensing element formed in the substrate, the third stress sensing element comprising:
a fifth resistor adapted to be coupled between a fifth current source and the voltage rail, the fifth resistor aligned to conduct current primarily in a third direction longitudinal to a second crystal axis different from the first crystal axis;
a sixth resistor adapted to be coupled between a sixth current source and the voltage rail, the sixth resistor aligned to conduct current primarily in a fourth direction transverse to the second crystal axis, a current from the fifth current source being proportional to a current from the sixth current source; and
a difference circuit having: a first input adapted to be coupled to a first voltage node between the fifth resistor and the fifth current source; a second input adapted to be coupled to a second voltage node between the sixth resistor and the sixth current source; and an output coupled to a third voltage node; the difference circuit configured to make a voltage at the third voltage node proportional to a difference between respective voltages at the first voltage node and the second voltage node.

13. An integrated circuit (IC) chip comprising:
a substrate comprising a piezoelectric material having a first resistivity coefficient for a first direction longitudinal to a crystal axis and a second resistivity coefficient for a second direction transverse to the crystal axis, the first and second resistivity coefficients having opposite signs; and a stress sensing element formed in the substrate, the stress sensing element comprising:
  a first resistor adapted to be coupled between a first current source and a voltage rail, the first resistor aligned to conduct current primarily in the first direction;
  a second resistor adapted to be coupled between a second current source and the voltage rail, the second resistor aligned to conduct current primarily in a third direction orthogonal to both the first and second directions, a current from the first current source being proportional to a current from the second current source; and
  a difference circuit having: a first input adapted to be coupled to a first voltage node between the first resistor and the first current source; a second input adapted to be coupled to a second voltage node between the second resistor and the second current source; and an output coupled to a third voltage node; the difference circuit configured to make a voltage at the third voltage node proportional to a difference between respective voltages at the first voltage node and the second voltage node.

14. The IC chip of claim 13 wherein the stress sensing element is a first stress sensing element, the difference circuit is a first difference circuit, and the IC chip further comprises a second stress sensing element formed in the substrate, the second stress sensing element comprising:
  a third resistor adapted to be coupled between a third current source and the voltage rail, the third resistor aligned to conduct current primarily in the second direction;
  a fourth resistor adapted to be coupled between a fourth current source and the voltage rail, the fourth resistor aligned to conduct current primarily in the third direction, a current from the third current source being proportional to a current from the fourth current source; and
  a second difference circuit having: a first input adapted to be coupled to a fourth voltage node between the third resistor and the third current source; a second input adapted to be coupled to a fifth voltage node between the fourth resistor and the fourth current source; and an output coupled to a sixth voltage node; the second difference circuit configured to make a voltage at the sixth voltage node proportional to a difference between respective voltages at the fourth voltage node and the fifth voltage node.

15. The IC chip of claim 14, further comprising a frequency compensation circuit having inputs coupled to respective outputs from the first stress sensing element and the second stress sensing element.

16. The IC chip of claim 15, wherein the IC further comprises an oscillator having inputs coupled to frequency adjustment outputs from the compensation circuit.

17. The IC chip of claim 14, wherein the crystal axis is a first crystal axis, and the IC chip further comprises a third stress sensing element formed in the substrate, the third stress sensing element comprising:
  a fifth resistor adapted to be coupled between a fifth current source and the voltage rail, the fifth resistor aligned to conduct current primarily in a fourth direction longitudinal to a second crystal axis different from the first crystal axis;
  a sixth resistor adapted to be coupled between a sixth current source and the voltage rail, the sixth resistor aligned to conduct current primarily in a fifth direction transverse to the second crystal axis, a current from the fifth current source being proportional to a current from the sixth current source; and
  a third difference circuit having: a first input adapted to be coupled to a seventh voltage node between the fifth resistor and the fifth current source; a second input adapted to be coupled to an eighth voltage node between the sixth resistor and the sixth current source; and an output coupled to a ninth voltage node; the third difference circuit configured to make a voltage at the ninth voltage node proportional to a difference between respective voltages at the seventh voltage node and the eighth voltage node.

* * * * *